(12) United States Patent
Kangude et al.

(10) Patent No.: US 12,444,621 B2
(45) Date of Patent: Oct. 14, 2025

(54) HIGH CONDUCTANCE DIVERT LINE ARCHITECTURE

(71) Applicant: Applied Materials, Inc., Santa Clara, CA (US)

(72) Inventors: Abhijit A. Kangude, San Jose, CA (US); Elizabeth Neville, Sunnyvale, CA (US); Arun Chakravarthy Chakravarthy, Panruit (IN)

(73) Assignee: Applied Materials, Inc., Santa Clara, CA (US)

( * ) Notice: Subject to any disclaimer, the term of this patent is extended or adjusted under 35 U.S.C. 154(b) by 693 days.

(21) Appl. No.: 17/880,885

(22) Filed: Aug. 4, 2022

(65) Prior Publication Data
US 2024/0047232 A1 Feb. 8, 2024

(51) Int. Cl.
*H01L 21/67* (2006.01)
(52) U.S. Cl.
CPC .. *H01L 21/67017* (2013.01); *H01L 21/67167* (2013.01)
(58) Field of Classification Search
CPC ......... H01L 21/67017; H01L 21/67167; H01L 21/6719
See application file for complete search history.

(56) References Cited

U.S. PATENT DOCUMENTS

| | | |
|---|---|---|
| 2005/0186339 A1 | 8/2005 | Rajagopalan et al. |
| 2013/0000731 A1 | 1/2013 | Singh et al. |
| 2016/0017493 A1 | 1/2016 | Dhas et al. |
| 2019/0340751 A1 | 11/2019 | Kim et al. |
| 2022/0189793 A1* | 6/2022 | Chakravarthy ..... H01L 21/6719 |

FOREIGN PATENT DOCUMENTS

| | | |
|---|---|---|
| TW | 201634718 A | 10/2016 |
| WO | 2022067016 A1 | 3/2022 |

OTHER PUBLICATIONS

Search Report for Taiwan Invention Patent Application No. 112129226 dated May 1, 2024, 10 pages.
Notice of Decision to Grant for Taiwan Invention Patent Application No. 112129226 dated Nov. 4, 2024, 5 pages.
Application No. PCT/US2023/029340, International Search Report and the Written Opinion, Mailed On Nov. 21, 2023, 8 pages.

* cited by examiner

*Primary Examiner* — Dale E Page
*Assistant Examiner* — Quovaunda Jefferson
(74) *Attorney, Agent, or Firm* — Kilpatrick Townsend & Stockton LLP

(57) ABSTRACT

Exemplary semiconductor processing systems may include a lid plate and a gas splitter. The gas splitter may be seated on the lid plate. The gas splitter may include a top surface and a plurality of side surfaces. The gas splitter may define a gas inlet, a gas outlet, a gas lumen that extends between and fluidly couples the gas inlet with the gas outlet, and a first divert lumen that is fluidly coupled with the gas lumen and that directs gases away from a processing chamber through a divert outlet. The semiconductor processing system may include a first divert weldment. The first divert weldment may extend from and fluidly couple to the divert outlet. The first divert weldment may include a first divert weldment outlet and a second divert weldment outlet.

20 Claims, 10 Drawing Sheets

HIGH CONDUCTANCE DIVERT LINE ARCHITECTURE

TECHNICAL FIELD

The present technology relates to semiconductor processes and equipment. More specifically, the present technology relates to semiconductor processing systems and components.

BACKGROUND

Semiconductor processing systems often utilize cluster tools to integrate a number of process chambers together. This configuration may facilitate the performance of several sequential processing operations without removing the substrate from a controlled processing environment, or it may allow a similar process to be performed on multiple substrates at once in the varying chambers. These chambers may include, for example, degas chambers, pretreatment chambers, transfer chambers, chemical vapor deposition chambers, physical vapor deposition chambers, etch chambers, metrology chambers, and other chambers. The combination of chambers in a cluster tool, as well as the operating conditions and parameters under which these chambers are run, are selected to fabricate specific structures using particular process recipes and process flows.

Processing operations often require the flow of process gases to be carefully controlled to ensure that deposition rates and film uniformity on wafer meet desired specifications. To help control such flow rates, some processing operations may involve diverting some or all of the process gases away from a processing chamber to tune the flow of gases into the chamber. However, such divert processes may lead to fluid pressure issues and/or condensation of process gases within the divert lines.

Thus, there is a need for improved systems and methods that can be used to efficiently divert process gases within semiconductor processing systems. These and other needs are addressed by the present technology.

SUMMARY

Exemplary semiconductor processing systems may include a plurality of processing chambers. Each processing chamber may define a processing region. The systems may include a lid plate positioned above the plurality of processing chambers. The systems may include a gas splitter seated on the lid plate. The gas splitter may include a top surface and a plurality of side surfaces. The gas splitter may define one or more gas inlets. The gas splitter may define one or more gas outlets. The gas splitter may define one or more gas lumens that extend between and fluidly couple the one or more gas inlets with each of the one or more gas outlets. The gas splitter may define a divert lumen that is fluidly coupled with the one or more gas lumens and that directs gases away from one of the plurality of processing chambers through a divert outlet. The systems may include a first divert weldment that extends from and fluidly couples to the divert outlet. The first divert weldment may include a first divert weldment outlet and a second divert weldment outlet.

In some embodiments, the systems may include a second divert weldment having a second divert weldment inlet and a third divert weldment inlet. The second divert weldment inlet may be in fluid communication with the first divert weldment outlet. The third divert weldment inlet may be in fluid communication with the second divert weldment outlet. The systems may include a first valve coupling the second divert weldment inlet to the first divert weldment outlet. The systems may include a second valve coupling the third divert weldment inlet to the second divert weldment outlet. The systems may include a first divert weldment filter disposed upstream of the first valve. The systems may include a second divert weldment filter disposed upstream of the second valve. The first divert weldment may be in fluid communication with a foreline. The systems may include between one and five heater jackets surrounding the first divert weldment.

Some embodiments of the present invention may encompass semiconductor processing systems that include a lid plate. The systems may include a gas splitter seated on the lid plate. The gas splitter may include a top surface and a plurality of side surfaces. The gas splitter may define a gas inlet. The gas splitter may define a gas outlet. The gas splitter may define a gas lumen that extends between and fluidly couples the gas inlet with the gas outlet. The gas splitter may define a divert lumen that is fluidly coupled with the gas lumen and that directs gases away from a processing chamber through a divert outlet. The systems may include a first divert weldment that extends from and fluidly couples to the divert outlet. The first divert weldment may include a first divert weldment outlet and a second divert weldment outlet.

In some embodiments, the systems may include a foreline in fluid communication with the first divert weldment. The systems may include a second divert weldment having a second divert weldment inlet, a third divert weldment inlet, and a third divert weldment outlet. The second divert weldment inlet may be coupled with the first divert weldment outlet. The third divert weldment inlet may be coupled with the second divert weldment outlet. The third divert weldment outlet may be coupled with the foreline. The systems may include a first valve coupling the second divert weldment inlet to the first divert weldment outlet. The systems may include a second valve coupling the third divert weldment inlet to the second divert weldment outlet. The first valve and the second valve may have a valve flow coefficient greater than or about 0.3 to less than or about 0.9. The gas lumen and the divert lumen may be fluidly coupled via at least one valve. The systems may include a valve block coupled with the at least one valve. The valve block may be coupled to the gas splitter. The first divert weldment may have an internal diameter of greater than or about 5.0 mm to less than or about 20.0 mm. The systems may include between one and five heater jackets surrounding the first divert weldment.

Some embodiments of the present invention my encompass semiconductor processing methods. The methods may include introducing a gas into a gas lumen defined by a gas splitter via a gas inlet end of the gas lumen. The methods may include directing a divert portion of the gas into a divert lumen that is fluidly coupled with the gas lumen. The methods may include flowing the divert portion of the gas through the divert lumen and into a divert weldment. The methods may include splitting the flow of the divert portion of the gas into a first divert portion and a second divert portion through a first divert weldment outlet and a second divert weldment outlet.

In some embodiments, the methods may include passing the first divert portion of the gas through a first filter and a first valve. The methods may include passing the second divert portion of the gas through a second filter and a second valve. The methods may include recombining the first divert portion of the gas and the second divert portion of the gas after flowing the first divert portion of the gas and the second divert portion of the gas through the first filter and the second filter. The methods may include passing a recombined first divert portion of the gas and the second divert portion of the gas to a foreline. A pressure in the divert weldment may be less than or about 150 Torr.

Such technology may provide numerous benefits over conventional systems and techniques. For example, the processing systems may provide multi-substrate processing capabilities that may be scaled well beyond conventional designs. Additionally, the processing systems may provide equal flow splitting between multiple chambers without slowing deposition rates. Embodiments may also reduce the stabilization time of gases prior to flowing the gases to the chamber. The processing systems may also provide the ability to tune deposition rates using divert flow paths, while accommodating higher flow rates of process gases. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
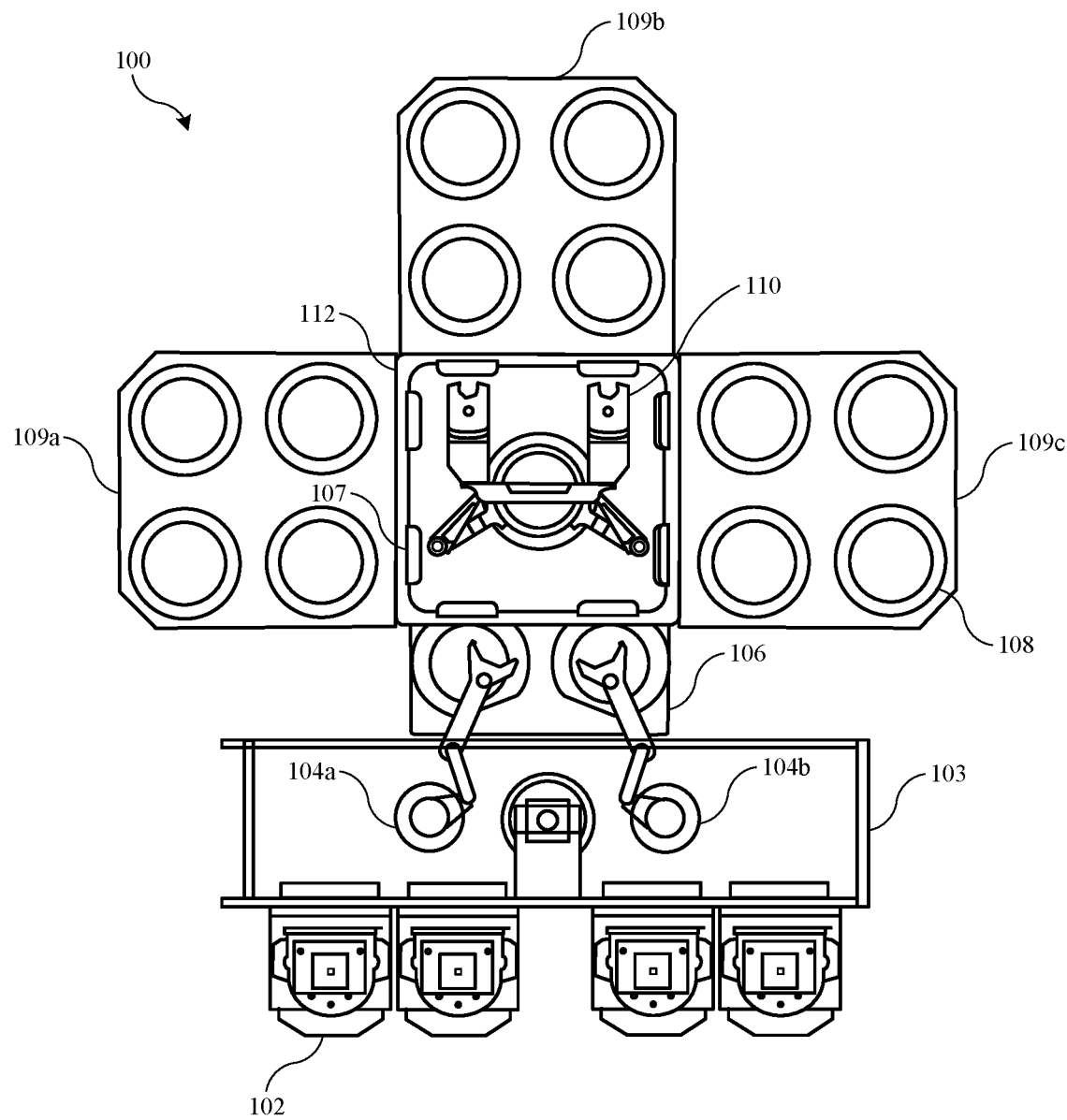
FIG. 1 shows a schematic top plan view of an exemplary processing system according to some embodiments of the present technology.

Several of the figures are included as schematics. It is to be understood that the figures are for illustrative purposes, and are not to be considered of scale or proportion unless specifically stated to be of scale or proportion. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Substrate processing can include time-intensive operations for adding, removing, or otherwise modifying materials on a wafer or semiconductor substrate. Efficient movement of the substrate may reduce queue times and improve substrate throughput. To improve the number of substrates processed within a cluster tool, additional chambers may be incorporated onto the mainframe. Although transfer robots and processing chambers can be continually added by lengthening the tool, this may become space inefficient as the footprint of the cluster tool scales. Accordingly, the present technology may include cluster tools with an increased number of processing chambers within a defined footprint. To accommodate the limited footprint about transfer robots, the present technology may increase the number of processing chambers laterally outward from the robot. For example, some conventional cluster tools may include one or two processing chambers positioned about sections of a centrally located transfer robot to maximize the number of chambers radially about the robot. The present technology may expand on this concept by incorporating additional chambers laterally outward as another row or group of chambers. For example, the present technology may be applied with cluster tools including three, four, five, six, or more processing chambers accessible at each of one or more robot access positions.

Multiple processing chambers may be supplied with process gases from a single source, with the flow of gases being evenly divided into separate streams for each processing chamber. Processing systems may include divert architecture that may be used to help tune the flow of process gases. As just one example, process gases may be diverted away from the processing chambers while a flow rate of the gases is being ramped up to a full flow rate to ensure that only the full flow rate is delivered to the chambers. However, as additional process locations are added, higher flow rates are needed to maintain an adequate flow rate of process gas to each chamber to achieve desired deposition rates. The maximum flow rate may be limited by the divert architecture, which may cause the pressure within divert lines to build up to excessive levels. This may result in pressure spikes and/or choked flow paths. Additionally, high pressures may result in condensation of process gases within the divert line when valves coupled with the divert line are suddenly opened and closed due to the high instantaneous pressure differential during the actuation of the valve. Condensation may lead to build up of residue and may alter the flow characteristics of the divert line.

The present technology may overcome these issues by incorporating a divert weldment that splits diverted process gases into multiple outlets, which may reduce the pressure in the divert line. The systems may include passive flow control devices, such as choke orifices, that may ensure flow from the gas source is equal between each chamber. The reduced pressure in the divert weldment may enable the orifice sizes in the upstream flow paths to be increased. Larger orifice sizes may allow higher flow rates of process gases to be flowed to the processing chambers, which may result in increased deposition rates.

Although the remaining disclosure will routinely identify specific structures, such as four-position chamber systems, for which the present structures and methods may be employed, it will be readily understood that the systems and methods are equally applicable to any number of structures and devices that may benefit from the structural capabilities explained. Accordingly, the technology should not be considered to be so limited as for use with any particular structures alone. Moreover, although an exemplary tool system will be described to provide foundation for the present technology, it is to be understood that the present technology can be incorporated with any number of semiconductor processing chambers and tools that may benefit from some or all of the operations and systems to be described.

FIG. 1 shows a top plan view of one embodiment of a semiconductor processing tool or processing system 100 of deposition, etching, baking, and curing chambers according to some embodiments of the present technology. In the figure, a set of front-opening unified pods 102 supply substrates of a variety of sizes that are received within a factory interface 103 by robotic arms 104a and 104b and placed into a load lock or low pressure holding area 106 before being delivered to one of the substrate processing regions 108, positioned in chamber systems or quad sections 109a-c, which may each be a semiconductor processing system having a transfer region fluidly coupled with a plurality of processing regions 108. Although a quad system is illustrated, it is to be understood that platforms incorporating standalone chambers, twin chambers, and other multiple chamber systems are equally encompassed by the present technology. A second robotic arm 110 housed in a transfer chamber 112 may be used to transport the substrate wafers from the holding area 106 to the quad sections 109 and back, and second robotic arm 110 may be housed in a transfer chamber with which each of the quad sections or processing systems may be connected. Each substrate processing region 108 can be outfitted to perform a number of semiconductor processing operations including any number of deposition processes including cyclical layer deposition, atomic layer deposition, chemical vapor deposition, physical vapor deposition, as well as etch, pre-clean, anneal, plasma processing, degas, orientation, and other substrate processes.

Each quad section 109 may include a transfer region that may receive substrates from, and deliver substrates to, second robotic arm 110. The transfer region of the chamber system may be aligned with the transfer chamber having the second robotic arm 110. In some embodiments the transfer region may be laterally accessible to the robot. In subsequent operations, components of the transfer sections may vertically translate the substrates into the overlying processing regions 108. Similarly, the transfer regions may also be operable to rotate substrates between positions within each transfer region. The substrate processing regions 108 may include any number of system components for depositing, annealing, curing and/or etching a material film on the substrate or wafer. In one configuration, two sets of the processing regions, such as the processing regions in quad section 109a and 109b, may be used to deposit material on the substrate, and the third set of processing chambers, such as the processing chambers or regions in quad section 109c, may be used to cure, anneal, or treat the deposited films. In another configuration, all three sets of chambers, such as all twelve chambers illustrated, may be configured to both deposit and/or cure a film on the substrate.

As illustrated in the figure, second robotic arm 110 may include two arms for delivering and/or retrieving multiple substrates simultaneously. For example, each quad section 109 may include two accesses 107 along a surface of a housing of the transfer region, which may be laterally aligned with the second robotic arm. The accesses may be defined along a surface adjacent the transfer chamber 112. In some embodiments, such as illustrated, the first access may be aligned with a first substrate support of the plurality of substrate supports of a quad section. Additionally, the second access may be aligned with a second substrate support of the plurality of substrate supports of the quad section. The first substrate support may be adjacent to the second substrate support, and the two substrate supports may define a first row of substrate supports in some embodiments. As shown in the illustrated configuration, a second row of substrate supports may be positioned behind the first row of substrate supports laterally outward from the transfer chamber 112. The two arms of the second robotic arm 110 may be spaced to allow the two arms to simultaneously enter a quad section or chamber system to deliver or retrieve one or two substrates to substrate supports within the transfer region.

Any one or more of the transfer regions described may be incorporated with additional chambers separated from the fabrication system shown in different embodiments. It will be appreciated that additional configurations of deposition, etching, annealing, and curing chambers for material films are contemplated by processing system 100. Additionally, any number of other processing systems may be utilized with the present technology, which may incorporate transfer systems for performing any of the specific operations, such as the substrate movement. In some embodiments, processing systems that may provide access to multiple processing chamber regions while maintaining a vacuum environment in various sections, such as the noted holding and transfer areas, may allow operations to be performed in multiple chambers while maintaining a particular vacuum environment between discrete processes.

Figure 2:
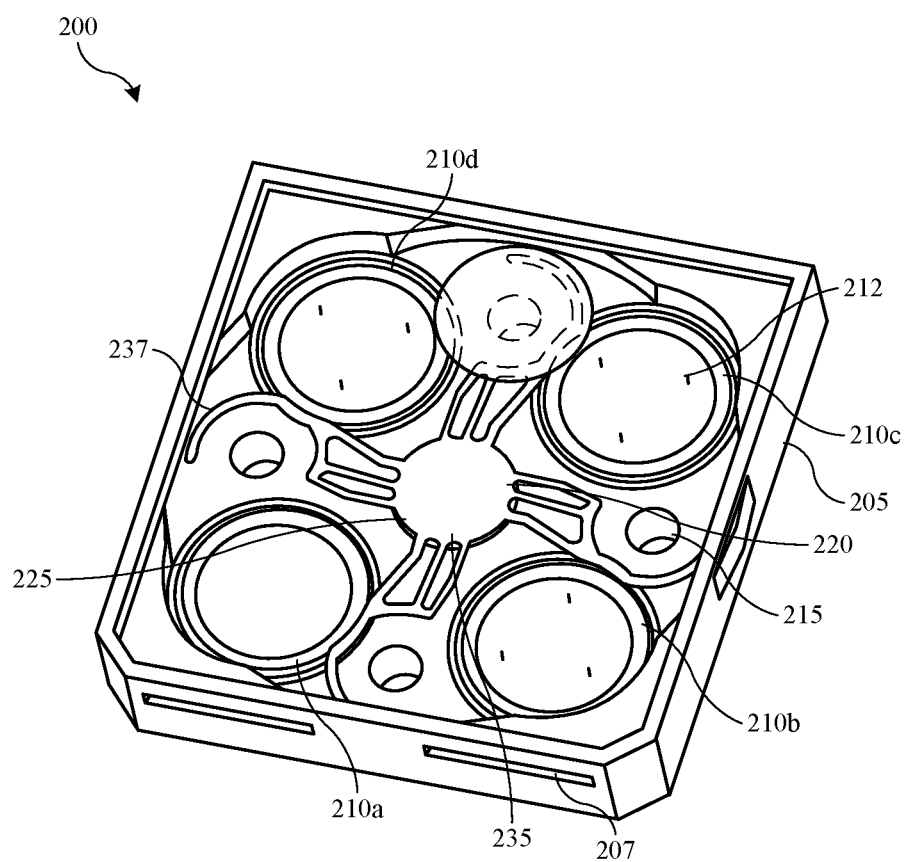
FIG. 2 shows a schematic isometric view of a transfer region of an exemplary chamber system according to some embodiments of the present technology.

As noted, processing system 100, or more specifically quad sections or chamber systems incorporated with processing system 100 or other processing systems, may include transfer sections positioned below the processing chamber regions illustrated. FIG. 2 shows a schematic isometric view of a transfer section of an exemplary chamber system 200 according to some embodiments of the present technology. FIG. 2 may illustrate additional aspects or variations of aspects of the transfer region described above, and may include any of the components or characteristics described. The system illustrated may include a transfer region housing 205, which may be a chamber body as discussed further below, defining a transfer region in which a number of components may be included. The transfer region may additionally be at least partially defined from above by processing chambers or processing regions fluidly coupled with the transfer region, such as processing chamber regions 108 illustrated in quad sections 109 of FIG. 1. A sidewall of the transfer region housing may define one or more access locations 207 through which substrates may be delivered and retrieved, such as by second robotic arm 110 as discussed above. Access locations 207 may be slit valves or other sealable access positions, which include doors or other sealing mechanisms to provide a hermetic environment within transfer region housing 205 in some embodiments. Although illustrated with two such access locations 207, it is to be understood that in some embodiments only a single access location 207 may be included, as well as access locations on multiple sides of the transfer region housing. It is also to be understood that the transfer section illustrated may be sized to accommodate any substrate size, including 200 mm, 300 mm, 450 mm, or larger or smaller substrates, including substrates characterized by any number of geometries or shapes.

Within transfer region housing 205 may be a plurality of substrate supports 210 positioned about the transfer region volume. Although four substrate supports are illustrated, it is to be understood that any number of substrate supports are similarly encompassed by embodiments of the present technology. For example, greater than or about three, four, five, six, eight, or more substrate supports 210 may be accommodated in transfer regions according to embodiments of the present technology. Second robotic arm 110 may deliver a substrate to either or both of substrate supports 210a or 210b through the accesses 207. Similarly, second robotic arm 110 may retrieve substrates from these locations. Lift pins 212 may protrude from the substrate supports 210, and may allow the robot to access beneath the substrates. The lift pins may be fixed on the substrate supports, or at a location where the substrate supports may recess below, or the lift pins may additionally be raised or lowered through the substrate supports in some embodiments. Substrate supports 210 may be vertically translatable, and in some embodiments may extend up to processing chamber regions of the semiconductor processing systems, such as processing chamber regions 108, positioned above the transfer region housing 205.

The transfer region housing 205 may provide access 215 for alignment systems, which may include an aligner that can extend through an aperture of the transfer region housing as illustrated and may operate in conjunction with a laser, camera, or other monitoring device protruding or transmitting through an adjacent aperture, and that may determine whether a substrate being translated is properly aligned. Transfer region housing 205 may also include a transfer apparatus 220 that may be operated in a number of ways to position substrates and move substrates between the various substrate supports. In one example, transfer apparatus 220 may move substrates on substrate supports 210a and 210b to substrate supports 210c and 210d, which may allow additional substrates to be delivered into the transfer chamber. Additional transfer operations may include rotating substrates between substrate supports for additional processing in overlying processing regions.

Transfer apparatus 220 may include a central hub 225 that may include one or more shafts extending into the transfer chamber. Coupled with the shaft may be an end effector 235. End effector 235 may include a plurality of arms 237 extending radially or laterally outward from the central hub. Although illustrated with a central body from which the arms extend, the end effector may additionally include separate arms that are each coupled with the shaft or central hub in various embodiments. Any number of arms may be included in embodiments of the present technology. In some embodiments a number of arms 237 may be similar or equal to the number of substrate supports 210 included in the chamber. Hence, as illustrated, for four substrate supports, transfer apparatus 220 may include four arms extending from the end effector. The arms may be characterized by any number of shapes and profiles, such as straight profiles or arcuate profiles, as well as including any number of distal profiles including hooks, rings, forks, or other designs for supporting a substrate and/or providing access to a substrate, such as for alignment or engagement.

The end effector 235, or components or portions of the end effector, may be used to contact substrates during transfer or movement. These components as well as the end effector may be made from or include a number of materials including conductive and/or insulative materials. The materials may be coated or plated in some embodiments to withstand contact with precursors or other chemicals that may pass into the transfer chamber from an overlying processing chamber.

Additionally, the materials may be provided or selected to withstand other environmental characteristics, such as temperature. In some embodiments, the substrate supports may be operable to heat a substrate disposed on the support. The substrate supports may be configured to increase a surface or substrate temperature to temperatures greater than or about 100° C., greater than or about 200° C., greater than or about 300° C., greater than or about 400° C., greater than or about 500° C., greater than or about 600° C., greater than or about 700° C., greater than or about 800° C., or higher. Any of these temperatures may be maintained during operations, and thus components of the transfer apparatus 220 may be exposed to any of these stated or encompassed temperatures. Consequently, in some embodiments any of the materials may be selected to accommodate these temperature regimes, and may include materials such as ceramics and metals that may be characterized by relatively low coefficients of thermal expansion, or other beneficial characteristics.

Component couplings may also be adapted for operation in high temperature and/or corrosive environments. For example, where end effectors and end portions are each ceramic, the coupling may include press fittings, snap fittings, or other fittings that may not include additional materials, such as bolts, which may expand and contract with temperature, and may cause cracking in the ceramics. In some embodiments the end portions may be continuous with the end effectors, and may be monolithically formed with the end effectors. Any number of other materials may be utilized that may facilitate operation or resistance during operation, and are similarly encompassed by the present technology. The transfer apparatus 220 may include a number of components and configurations that may facilitate the movement of the end effector in multiple directions, which may facilitate rotational movement, as well as vertical movement, or lateral movement in one or more ways with the drive system components to which the end effector may be coupled.

Figure 3:
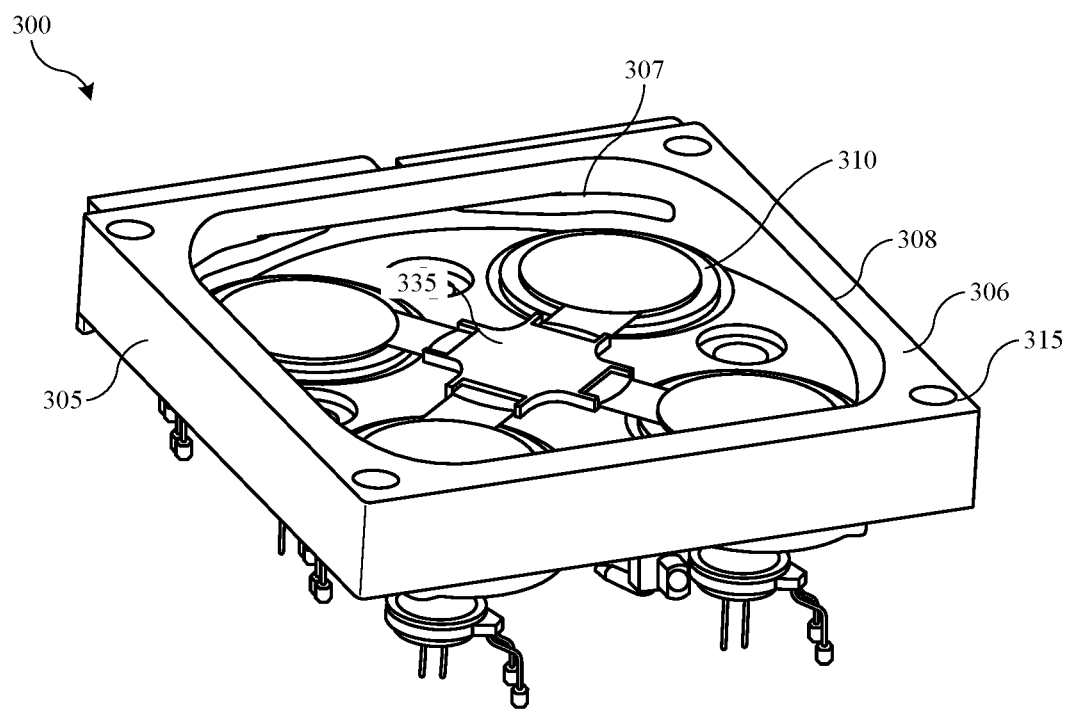
FIG. 3 shows a schematic isometric view of a transfer region of an exemplary chamber system according to some embodiments of the present technology.

FIG. 3 shows a schematic isometric view of a transfer region of a chamber system 300 of an exemplary chamber system according to some embodiments of the present technology. Chamber system 300 may be similar to the transfer region of chamber system 200 described above, and may include similar components including any of the components, characteristics, or configurations described above. FIG. 3 may also illustrate certain component couplings encompassed by the present technology along with the following figures.

Chamber system 300 may include a chamber body 305 or housing defining the transfer region. Within the defined volume may be a plurality of substrate supports 310 distributed about the chamber body as previously described. As will be described further below, each substrate support 310 may be vertically translatable along a central axis of the substrate support between a first position illustrated in the figure, and a second position where substrate processing may be performed. Chamber body 305 may also define one or more accesses 307 through the chamber body. A transfer apparatus 335 may be positioned within the transfer region and be configured to engage and rotate substrates among the substrate supports 310 within the transfer region as previously described. For example, transfer apparatus 335 may be rotatable about a central axis of the transfer apparatus to reposition substrates. The transfer apparatus 335 may also be laterally translatable in some embodiments to further facilitate repositioning substrates at each substrate support.

Chamber body 305 may include a top surface 306, which may provide support for overlying components of the system. Top surface 306 may define a gasket groove 308, which may provide seating for a gasket to provide hermetic sealing of overlying components for vacuum processing. Unlike some conventional systems, chamber system 300, and other chamber systems according to some embodiments of the present technology, may include an open transfer region within the processing chamber, and processing regions may be formed overlying the transfer region. Because of transfer apparatus 335 creating an area of sweep, supports or structure for separating processing regions may not be available. Consequently, the present technology may utilize overlying lid structures to form segregated processing regions overlying the open transfer region as will be described below. Hence, in some embodiments sealing between the chamber body and an overlying component may only occur about an outer chamber body wall defining the transfer region, and interior coupling may not be present in some embodiments. Chamber body 305 may also define apertures 315, which may facilitate exhaust flow from the processing regions of the overlying structures. Top surface 306 of chamber body 305 may also define one or more gasket grooves about the apertures 315 for sealing with an overlying component. Additionally, the apertures may provide locating features that may facilitate stacking of components in some embodiments.

Figure 4:
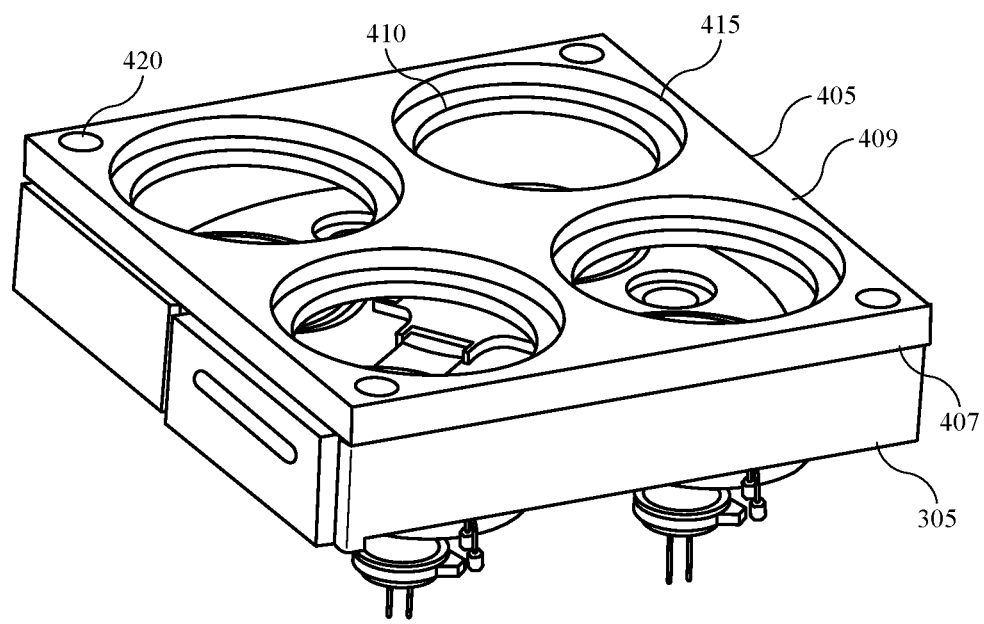
FIG. 4 shows a schematic isometric view of a transfer region of an exemplary chamber system according to some embodiments of the present technology.

FIG. 4 shows a schematic isometric view of overlying structures of chamber system 300 according to some embodiments of the present technology. For example, in some embodiments a first lid plate 405 may be seated on chamber body 305. First lid plate 405 may by characterized by a first surface 407 and a second surface 409 opposite the first surface. First surface 407 of the first lid plate 405 may contact chamber body 305, and may define companion grooves to cooperate with grooves 308 discussed above to produce a gasket channel between the components. First lid plate 405 may also define apertures 410, which may provide separation of overlying regions of the transfer chamber to form processing regions for substrate processing.

Apertures 410 may be defined through first lid plate 405, and may be at least partially aligned with substrate supports in the transfer region. In some embodiments, a number of apertures 410 may equal a number of substrate supports in the transfer region, and each aperture 410 may be axially aligned with a substrate support of the plurality of substrate supports. As will be described further below, the processing regions may be at least partially defined by the substrate supports when vertically raised to a second position within the chamber systems. The substrate supports may extend through the apertures 410 of the first lid plate 405. Accordingly, in some embodiments apertures 410 of the first lid plate 405 may be characterized by a diameter greater than a diameter of an associated substrate support. Depending on an amount of clearance, the diameter may be less than or about 25% greater than a diameter of a substrate support, and in some embodiments may be less than or about 20% greater, less than or about 15% greater, less than or about 10% greater, less than or about 9% greater, less than or about 8% greater, less than or about 7% greater, less than or about 6% greater, less than or about 5% greater, less than or about 4% greater, less than or about 3% greater, less than or about 2% greater, less than or about 1% greater than a diameter of a substrate support, or less, which may provide a minimum gap distance between the substrate support and the apertures 410.

First lid plate 405 may also include a second surface 409 opposite first surface 407. Second surface 409 may define a recessed ledge 415, which may produce an annular recessed shelf through the second surface 409 of first lid plate 405. Recessed ledges 415 may be defined about each aperture of the plurality of apertures 410 in some embodiments. The recessed shelf may provide support for lid stack components as will be described further below. Additionally, first lid plate 405 may define second apertures 420, which may at least partially define pumping channels from overlying components described below. Second apertures 420 may be axially aligned with apertures 315 of the chamber body 305 described previously.

Figure 5:
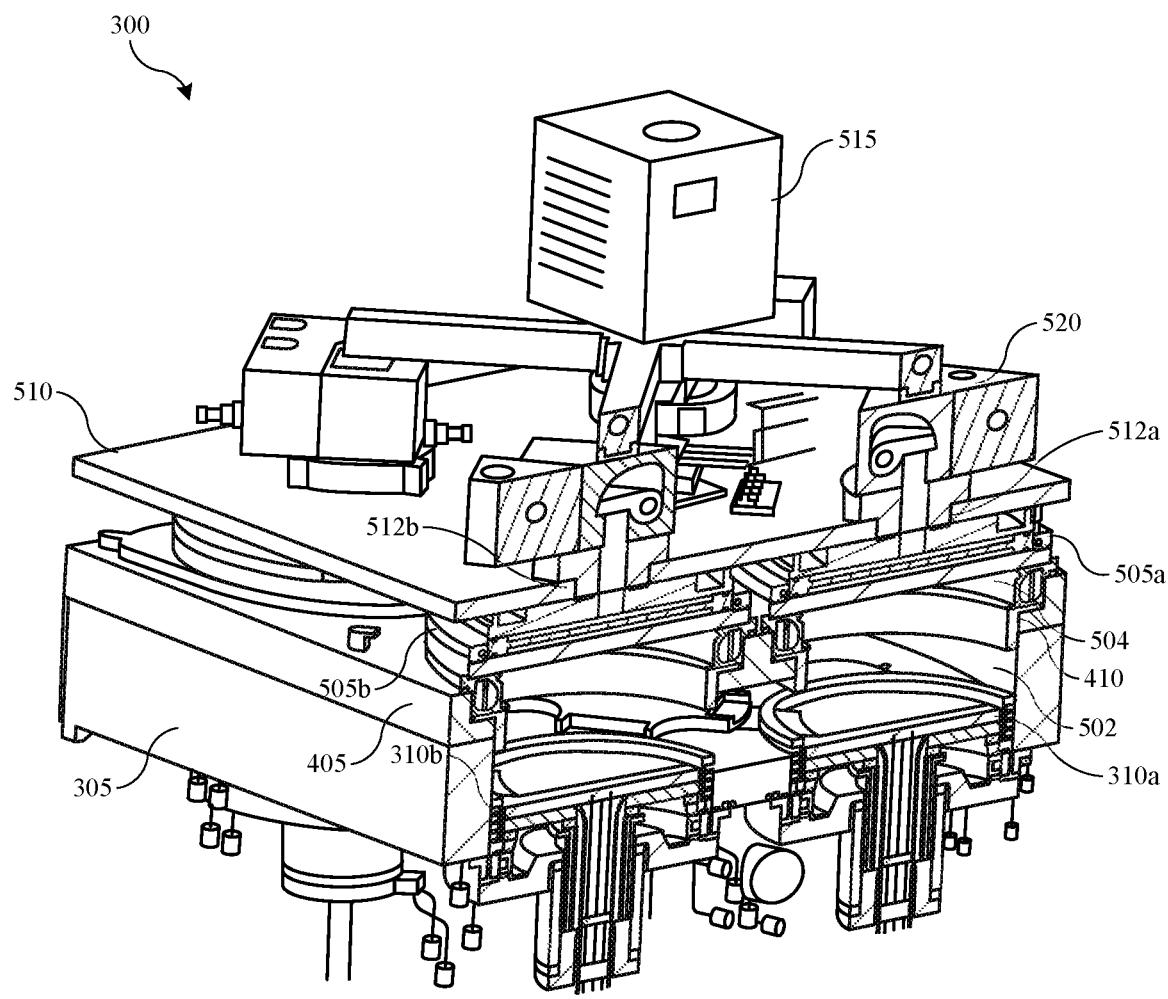
FIG. 5 shows a schematic partial isometric view of a chamber system according to some embodiments of the present technology.

FIG. 5 shows a schematic partial isometric view of chamber system 300 according to some embodiments of the present technology. The figure may illustrate a partial cross-section through two processing regions and a portion of a transfer region of the chamber system. For example, chamber system 300 may be a quad section of processing system 100 described previously, and may include any of the components of any of the previously described components or systems.

Chamber system 300, as developed through the figure, may include a chamber body 305 defining a transfer region 502 including substrate supports 310, which may extend into the chamber body 305 and be vertically translatable as previously described. First lid plate 405 may be seated overlying the chamber body 305, and may define apertures 410 producing access for processing region 504 to be formed with additional chamber system components. Seated about or at least partially within each aperture may be a lid stack 505, and chamber system 300 may include a plurality of lid stacks 505, including a number of lid stacks equal to a number of apertures 410 of the plurality of apertures. Each lid stack 505 may be seated on the first lid plate 405, and may be seated on a shelf produced by recessed ledges through the second surface of the first lid plate. The lid stacks 505 may at least partially define processing regions 504 of the chamber system 300.

As illustrated, processing regions 504 may be vertically offset from the transfer region 502, but may be fluidly coupled with the transfer region. Additionally, the processing regions may be separated from the other processing regions. Although the processing regions may be fluidly coupled with other processing regions through the transfer region from below, the processing regions may be fluidly isolated, from above, from each of the other processing regions. Each lid stack 505 may also be aligned with a substrate support in some embodiments. For example, as illustrated, lid stack 505a may be aligned over substrate support 310a, and lid stack 505b may be aligned over substrate support 310b. When raised to operational positions, such as a second position, the substrates may deliver substrates for individual processing within the separate processing regions. When in this position, as will be described further below, each processing region 504 may be at least partially defined from below by an associated substrate support in the second position.

FIG. 5 also illustrates embodiments in which a second lid plate 510 may be included for the chamber system. Second lid plate 510 may be coupled with each of the lid stacks, which may be positioned between the first lid plate 405 and the second lid plate 510 in some embodiments. As will be explained below, the second lid plate 510 may facilitate accessing components of the lid stacks 505. Second lid plate 510 may define a plurality of apertures 512 through the second lid plate. Each aperture of the plurality of apertures may be defined to provide fluid access to a specific lid stack 505 or processing region 504. A remote plasma unit 515 may optionally be included in chamber system 300 in some embodiments, and may be supported on second lid plate 510. In some embodiments, remote plasma unit 515 may be fluidly coupled with each aperture 512 of the plurality of apertures through second lid plate 510. Isolation valves 520 may be included along each fluid line to provide fluid control to each individual processing region 504. For example, as illustrated, aperture 512a may provide fluid access to lid stack 505a. Aperture 512a may also be axially aligned with any of the lid stack components, as well as with substrate support 310a in some embodiments, which may produce an axial alignment for each of the components associated with individual processing regions, such as along a central axis through the substrate support or any of the components associated with a particular processing region 504. Similarly, aperture 512b may provide fluid access to lid stack 505b, and may be aligned, including axially aligned with components of the lid stack as well as substrate support 310b in some embodiments.

Figure 6:
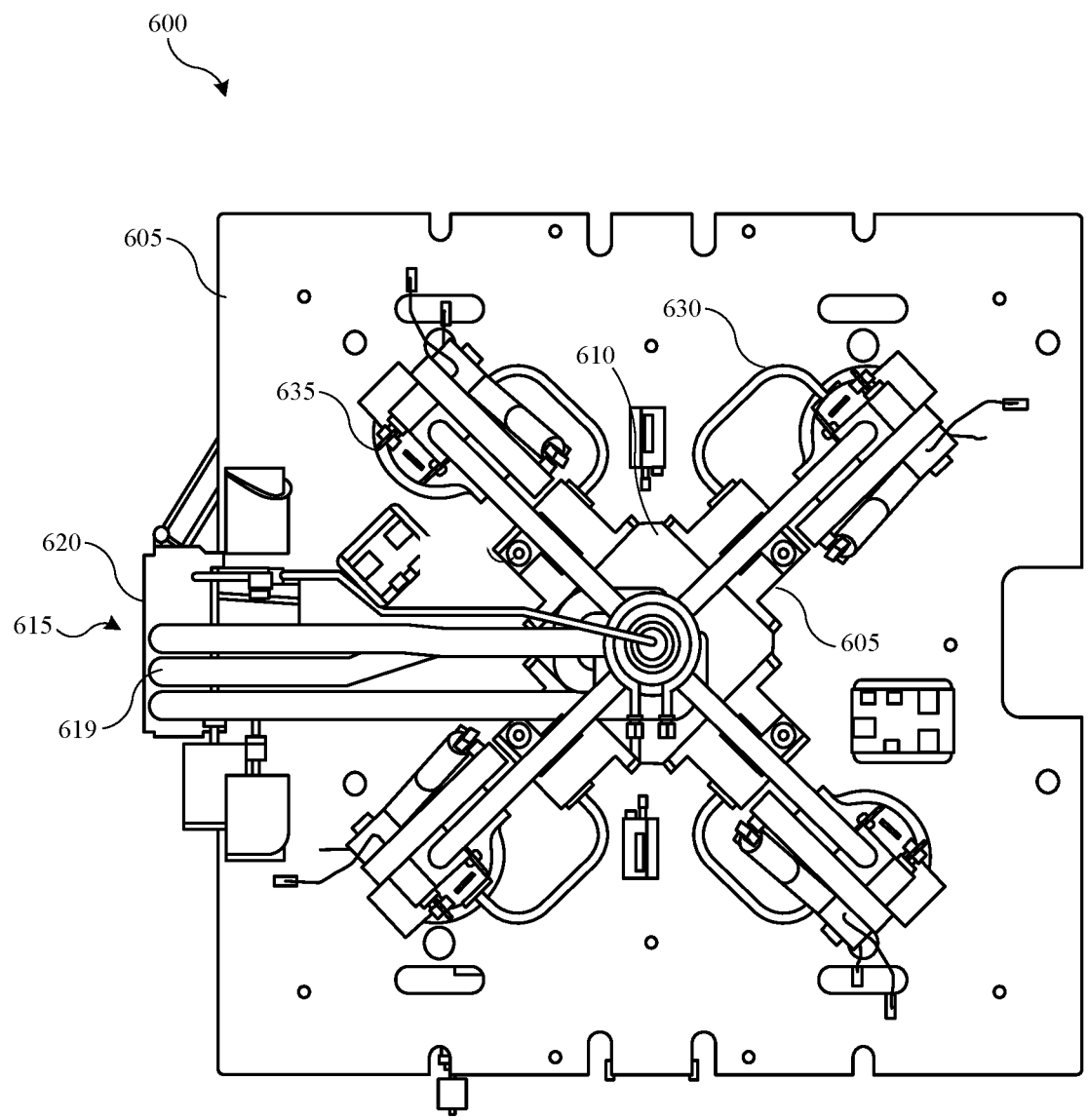
FIG. 6 shows a schematic top plan view of an exemplary processing system according to some embodiments of the present technology.

FIG. 6 shows a schematic top plan view of one embodiment of semiconductor processing system 600 according to some embodiments of the present technology. The figure may include components of any of the systems illustrated and described previously, and may also show further aspects of any of the previously described systems. It is to be understood that the illustration may also show exemplary components as would be seen on any quad section 109 described above.

Semiconductor processing system 600 may include a lid plate 605, which may be similar to second lid plate 510 previously described. For example, the lid plate 605 may define a number of apertures, similar to apertures 512, which provide access to a number of processing chambers positioned beneath the lid plate 605. Each aperture of the plurality of apertures may be defined to provide fluid access to a specific lid stack, processing chamber, and/or processing region.

A gas splitter 610 may be seated on a top surface of the lid plate 605. For example, the gas splitter 610 may be centered between the apertures of the lid plate 605. The gas splitter 610 may be fluidly coupled with a number of input weldments 615 that deliver gases, such as precursors, plasma effluents, and/or purge gases from a number of gas sources to the gas splitter 610. For example, each of the input weldments 615 may extend vertically from gas sources positioned below the lid plate 605 and pass through a feedthrough plate 620. A portion of the input weldments 615 above the feedthrough plate 620 may be bent horizontally and may direct the gases toward the gas splitter 610. In some embodiments, some or all of the input weldments 615 may be disposed within heater jackets 619 that help prevent heat loss along the length of the input weldments 615.

As will be discussed further below, the gas splitter 610 may receive gases from the input weldments 615 and may recursively split the gas flows into a greater number of gas outputs that are each interfaced with a respective one of a number of valve blocks 625. The valve blocks 625 may interface with one or more valves 627 that help control flow of gases through the valve block 625. For example, actuation of the valves 627 at each valve block 625 may control whether purge and/or process gases are flowed to a respective processing chamber or are diverted away from the processing chamber to another location of the system 600. For example, outlets of each of the valve blocks 625 may each be fluidly coupled with an output weldment 630, which may deliver the purge gas and/or process gas to an output manifold 635 associated with a particular processing chamber. For example, an output manifold 635 may be positioned over each aperture formed within the lid plate 605 and may be fluidly coupled with the lid stack components to deliver one or more gases to a processing region of a respective processing chamber.

Figure 7:
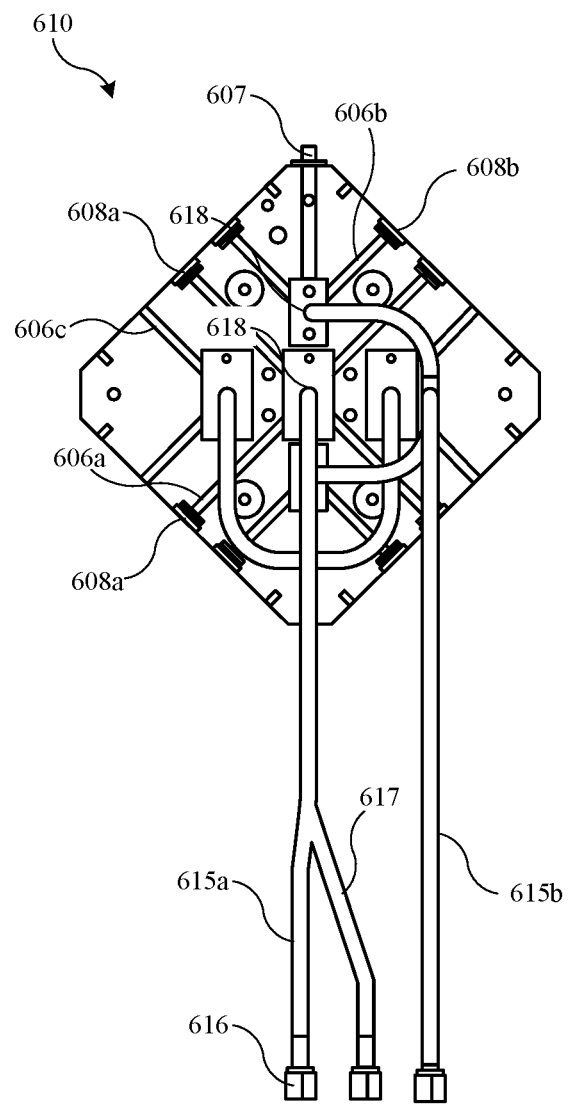
FIG. 7 shows a schematic top plan view of an exemplary gas splitter according to some embodiments of the present technology.

FIG. 7 shows a schematic top plan view of the gas splitter 610 interfaced with a number of input weldments 615. Each of the input weldments 615 defines a gas channel formed between an inlet 616 and an outlet 618. Outlets 618 of each of the input weldments 615 may be coupled with a respective gas inlet of the gas splitter 610, which may enable gas to be flowed from each gas source through the input weldments 615 and into the gas splitter 610. As just one example, a first input weldment 615a may deliver a deposition gas, such as, but not limited to, tetraethyl orthosilicate ("TEOS") or any other silicon-containing precursor, to a single gas inlet of the gas splitter 610. A second input weldment 615b may deliver a carrier gas (such as argon) and/or an oxygen-containing precursor, such as diatomic oxygen, ozone, and/or nitrogen-containing precursors that incorporate oxygen, water, alcohol, or other materials to two or more gas inlet of the gas splitter 610. While shown with two input weldments, it will be appreciated that a single input weldment that delivers one gas or a mixture of gases may be used in some embodiments. In other embodiments, greater than two input weldments may be provided. In some embodiments, one or more divert weldments 617 may be coupled with the gas splitter 610 to direct gases away from the processing chambers and the gas splitter 610, such as to a foreline. Such an arrangement may enable up to three different chemistries to be delivered to a processing chamber (e.g., gas from just first input weldment 615a, gas from just second input weldment 615b, or gas from both the first input weldment 615a and the second input weldment 615b). As illustrated, divert weldment 617 includes two branches that each couple with the gas splitter 610. It will be appreciated that any number of branches (including a single branch) may be provided on the divert weldment 617. Gas flow through each of these branches joins and is flowed away from the gas splitter 610. It will be understood that other arrangements of weldments are possible, including arrangements that include more or fewer weldments, with greater number of weldments enabling greater numbers of chemistries of gases to be delivered to the processing chambers with a single weldment arrangement.

The gas splitter 610 may define a number of gas channels 606 that extend between and fluidly couple the gas inlets of the gas splitter 610 with gas outlets 608 of the gas splitter 610. At least some of the gas channels 606 may split gas flow from a single gas inlet to multiple gas outlets 608 such that the gas splitter 610 includes a greater number of gas outlets 608 than gas inlets. As illustrated, four gas channels 606a extend radially outward from the outlet 618 of the first input weldment 615a and split flow from the first input weldment 615a to deliver gas to four different gas outlets 608a. Each of the gas outlets 608a may be positioned on a different side of the gas splitter 610. This allows a single gas source to provide equal flow rates of gas through each of the four gas outlets 608a using a single input weldment 615 (with a single outlet) and single gas splitter 610. Two gas channels 606b may be fluidly coupled with each of the outlets 618 of the second input weldment 615b. Each gas channel 606b may deliver gas to a different one of four gas outlets 608b, with each of the gas outlets 608b being positioned on a different side of the gas splitter 610. Such a design enables a single input weldment 615 that splits into two outlets to deliver gas to four different gas outlets 608b. Each side of the gas splitter 610 may include an inlet for a divert gas lumen 606c. Each divert gas lumen 606c may couple with the divert weldment 617. It is to be understood that the arrangement of gas inlets, gas outlets 608, and gas channels 606 is merely representative of a single embodiment of a gas splitter 610 and that numerous variations in placement and orientation of the gas inlets, gas outlets 608, and/or gas channels 606 is possible. The lumens and ports of gas splitter 610 may be modified based on a number of input weldments Additionally, gas channels 606 may be arranged to provide any number of flow paths, including single flow paths, from a given gas inlet. Gas splitter 610 may be designed to accommodate any number of input weldments from various gas sources, allowing the number of chemistries enabled by the gas splitter to be scaled to meet the demands of a particular processing operation.

In some embodiments, the gas splitter 610 may include a heat source. For example, a heater cartridge 607 may be coupled with and/or embedded within a body of the gas splitter 610. In some embodiments, the heat cartridge 607 may be positioned at a center of the gas splitter 610, which may provide a uniform temperature gradient across the gas splitter 610. By providing a heat source within the gas splitter 610, greater temperature control may be afforded to the system 600, which may improve the quality and uniformity of film deposition operations. The heat source may heat the gas splitter 610 to temperatures of about or greater than 75° C., about or greater than 100° C., about or greater than 125° C., about or greater than 150° C., about or greater than 175° C., about or greater than 200° C., or more.

Figure 8:
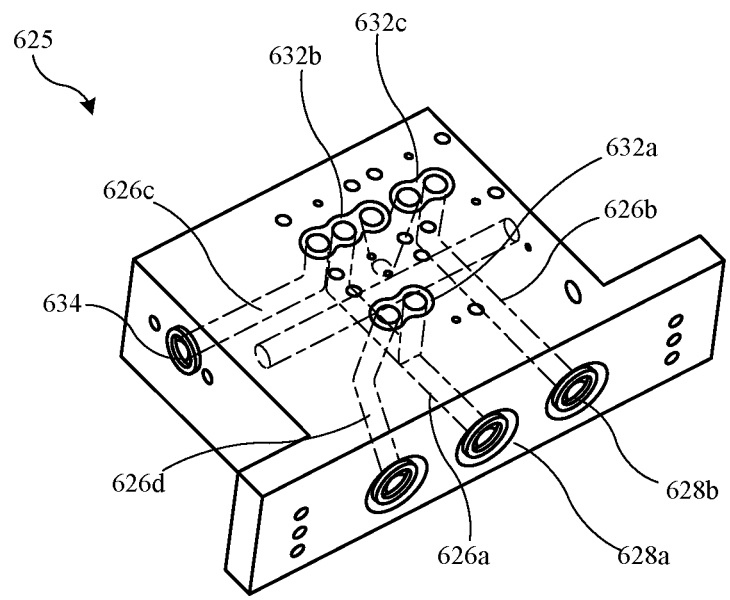
FIG. 8 shows a schematic isometric view of an exemplary valve block according to some embodiments of the present technology.

FIG. 8 shows a schematic isometric view of one of the valve blocks 625. Each of the valve blocks 625 may define a number of gas lumens 626 that may deliver gas from an inlet 628 to one or more valve locations 632. For example, a first gas lumen 626a may extend from inlet 628a (which may be fluidly coupled with one of the gas outlets 608a of the gas splitter 610 to flow a deposition gas) and may be fluidly coupled with a first valve location 632a and a second valve location 632b. A valve (such as valve 627) may be coupled with the first valve location 632a, which may operate to selectively divert gases flowed through the first gas lumen 626a to a divert gas lumen 626d, which may be fluidly coupled with divert gas lumen 606c of the gas splitter 610. A valve may be coupled with the second valve location 632b, which may operate to selectively flow gases through a delivery gas lumen 626c to a delivery outlet 634. The delivery outlet 634 may be coupled with one of the output weldments 630 to deliver gases to one of the processing chambers via one of the output manifolds 635. In some embodiments, valves interfaced with a particular valve block 625 may divert flow of a deposition gas through the divert gas lumen 626d while a flow rate of the deposition gas is being ramped up to a full flow rate. Once a full flow rate is reached, the valve may switch to deliver a full stable flow rate of deposition gas to the processing chamber via the delivery outlet 634. A second gas lumen 626b may extend from inlet 628b (which may be fluidly coupled with one of the gas outlets 608b of the gas splitter 610) and may be fluidly coupled with a third valve location 632c. A valve may be coupled with the third valve location 632c, which may operate to selectively direct gases flowed through the second gas lumen 626b to a the second valve location 632b for subsequent delivery to the delivery outlet 634.

Figure 9:
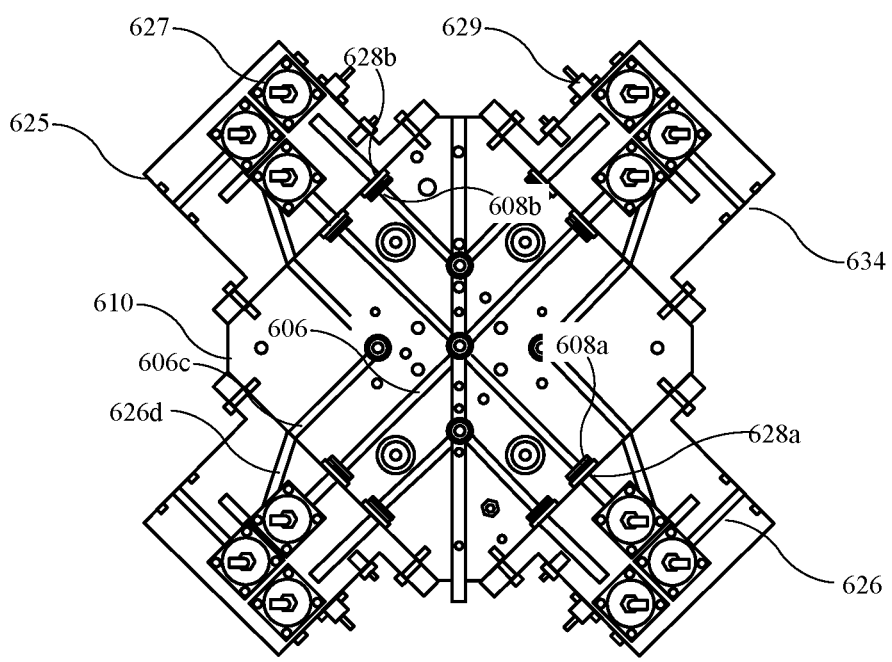
FIG. 9 shows a schematic top plan view of an exemplary interface between a gas splitter and a number of valve blocks according to some embodiments of the present technology.

FIG. 9 shows a schematic top plan view of the gas splitter 610 interfaced with a number of valve blocks 625. As illustrated, the gas splitter 610 has four primary sides, with a separate valve block 625 interfaced with each side of the gas splitter 610. However, it will be understood that other numbers of valve block 625 may be interfaced with a single gas splitter. In some embodiments, a number of valve blocks 625 may match a number of processing chambers present within the processing system 600 such that each processing chamber may have a dedicated valve block 625. This enables gas flows to be switched at each valve block 625 independently of one another, which may allow gas flow to be tuned in a manner that emulates a processing system that has separate gas sources for each processing chamber. For example, a deposition gas may be flowed to all four processing chambers via the gas splitter 610 and the valve blocks 625. If a deposition rate in one or more of the chambers is higher than the other chambers, the valves 627 and valve block 625 associated with the chamber(s) with the high deposition rate may divert flow of the deposition gas away from the respective chamber(s) to tune a deposition rate individual chambers.

When the gas splitter 610 is interfaced with the valve blocks 625, the gas outlets 608 of the gas splitter 610 may be aligned and interfaced with respective inlets 628 of the valve blocks 625 to provide gas flow paths from the gas splitter 610 to the delivery outlet 634 and/or to provide divert flow paths between the valve blocks 625 and the gas splitter 610. For example, the gas outlets 608a may each be interfaced with one of the inlets 628a of the valve blocks 625 and the gas outlets 608b may each be interfaced with one of the inlets 628b of the valve blocks 625. Exposed ends of each of the divert lumens 606c of the gas splitter 610 may be interfaced with an output of the divert gas lumen 626d of one of the valve blocks 625.

In some embodiments, each valve block 625 may include a heat source. For example, a heater cartridge 629 may be coupled with and/or embedded within a body of the valve block 625. In some embodiments, the heater cartridge 629 may be positioned proximate the first gas lumen 626a (which may flow a process gas, such as TEOS), which may provide heat to the process gas. By providing a heat source within the valve block 625, greater temperature control may be afforded to the system 600, which may improve the quality and uniformity of film deposition operations. The heat source may heat the valve block 625 to temperatures of about or greater than 75° C., about or greater than 100° C., about or greater than 125° C., about or greater than 150° C., about or greater than 175° C., about or greater than 200° C., or more.

Figure 10A:
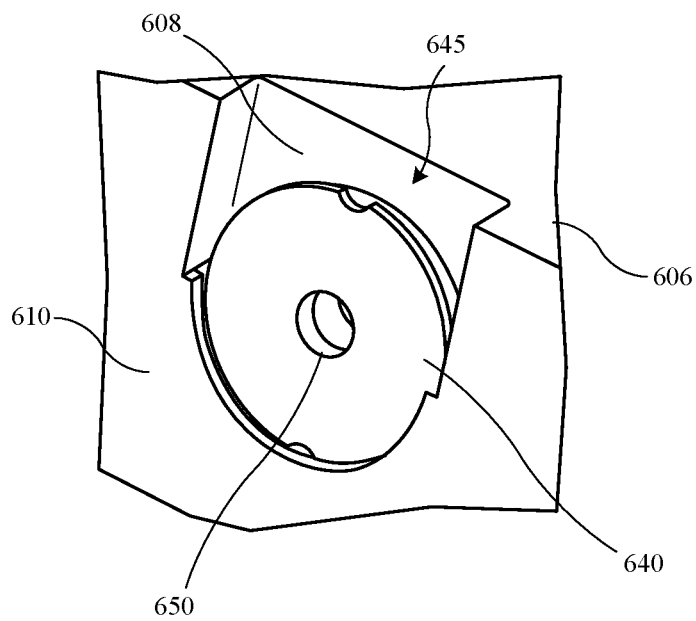
FIG. 10A shows a schematic isometric view of an exemplary choke plate according to some embodiments of the present technology.
Figure 10B:
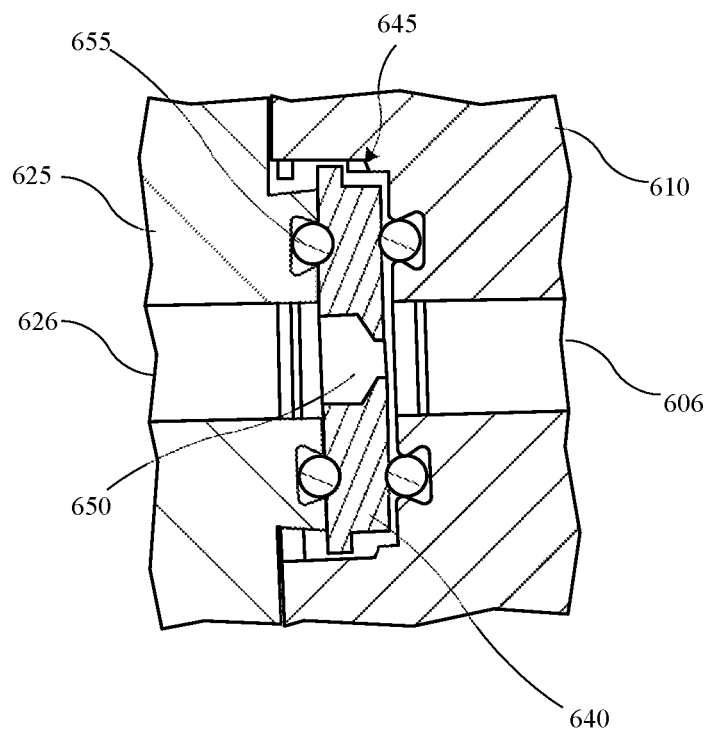
FIG. 10B shows a schematic cross-sectional top plan view of an exemplary choke plate according to some embodiments of the present technology.

The interfaces between the gas splitter 610 and each of the valve blocks 625 may include a choke. For example, an opening of each gas outlet 608 of the gas splitter 610 and/or an opening of each inlet 628 of the valve blocks 625 may include a choke. The choke may be in the form of a choke plate that defines an aperture having a reduced diameter relative to the gas channels 606 and/or gas lumens 626. FIG. 10A shows a schematic isometric view of one embodiment of a choke plate 640 secured with a gas outlet 608 of gas splitter 610 (although some embodiments may alternatively or additionally include a choke plate at an inlet 628 of a valve block 625). The choke plate 640 may be received and secured within a slot 645 formed at the gas outlet 608. In some embodiments, one or more O-rings 655 may be used to seal an interface between a body of the choke plate 640 and faces of the gas splitter 610 and/or valve block 625 to prevent any gases flowing through the choke plate 640 from leaking out of the interface as illustrated in the schematic cross-sectional top elevation view of FIG. 10B. The choke plate 640 may define a central orifice 650 that has a diameter that is smaller than diameters of the gas channels 606 and gas lumens 626. As illustrated, an upstream side of the central orifice 650 may have a smaller diameter than a downstream side of the central orifice 650. For example, a diameter of the central orifice 650 may taper and/or abruptly increase in diameter from the upstream side of the choke plate 640 to the downstream side. In other embodiments, the central orifice 650 may have a constant diameter across a thickness of the choke plate 640. The reduced diameter of the central orifice 650 relative to the diameters of gas channels 606 and gas lumens 626 enables the central orifice 650 to serve as a passive flow control device that enables downstream components (including valve blocks, output weldments, manifolds, lid stacks, etc.) to be modified or replaced without the need for any further flow rate tuning. Such modifications may be made without further flow rate tuning as long as the pressure upstream of the choke plates 640 stays the same at each interface of the gas splitter 610 and the valve blocks 625, which may be achieved by maintaining the same sizes of central orifice 650 at each interface location. The choke point provided by the central orifice 650 ensures that the flow rate through the central orifice 650 is a function of only upstream pressure, as an amount of gas flowing through the choke point depends only on pressure upstream of the central orifices 650.

O-rings or gaskets may be seated between each component of the system 600. In particular, O-rings or gaskets may be seated between couplings of various gas lines, which may help seal the component connections and prevent gas leakage in some embodiments.

Figure 11:
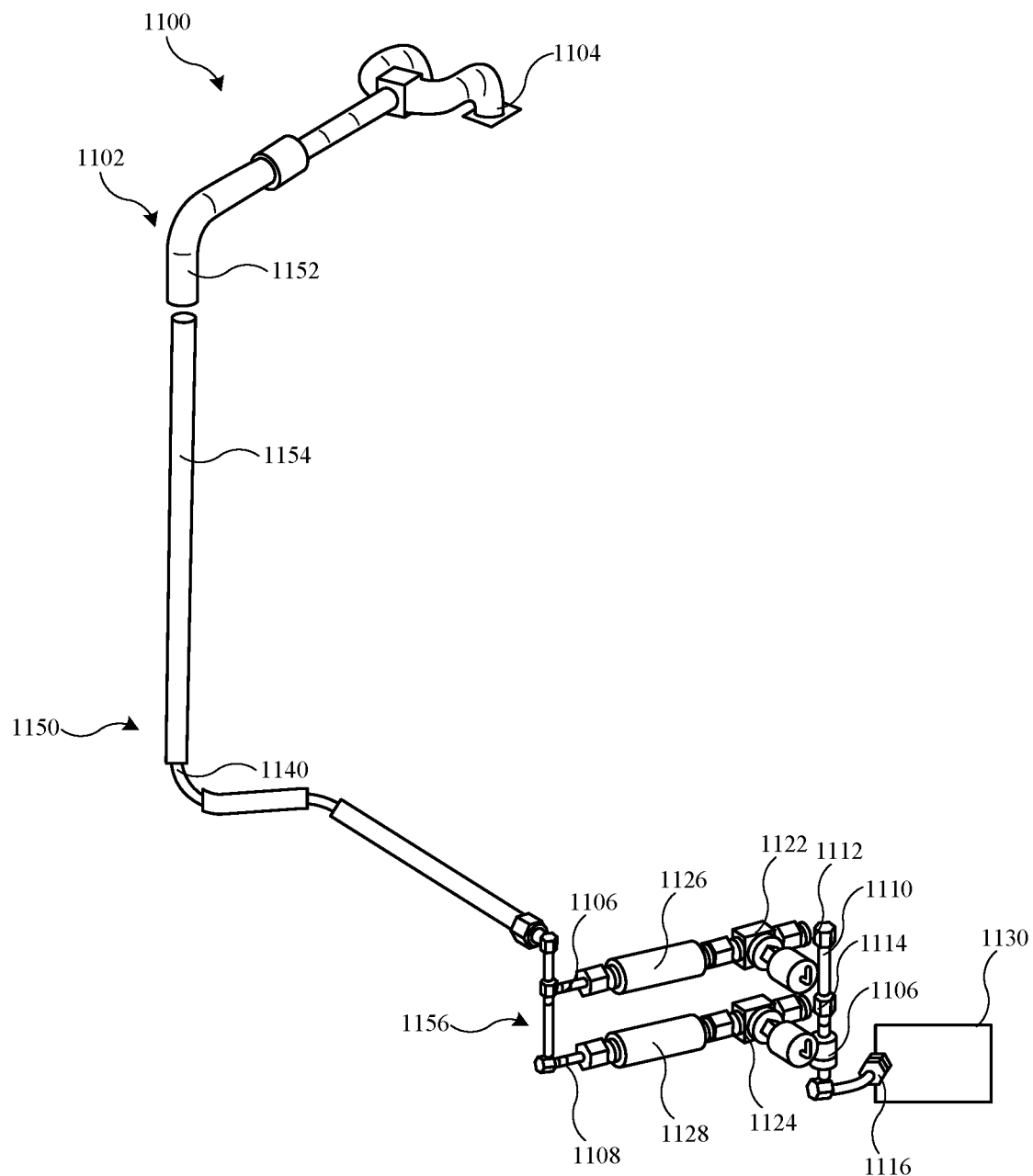
FIG. 11 shows a schematic isometric view of an exemplary divert architecture according to some embodiments of the present technology.

FIG. 11 shows a schematic isometric view of a divert architecture 1100. Divert architecture 1100 may be used to divert process gases away from processing chambers and into exhaust systems. Process gases may be diverted away from processing chambers for any number of reasons. For example, a portion of process gases may be diverted from one or more of the processing chambers to tune a flow rate of the process gases to the various chambers, such as to equalize flow to each chamber. In other instances, the process gases may be diverted away from each of the processing chambers while the gas panel or other gas source ramps up a flow rate of the process gases to a full flow rate. This diverting of process gases may be performed to ensure that only the full flow rate is delivered to the chambers, which may help improve the control of deposition rate within each of the processing chambers. Divert architecture 1100 may include a number of divert weldments. While described as being weldments, it will be appreciated that as used herein the term "weldment" may refer to other conduits used to transport gases within a processing system. The divert architecture 1100 may include a first divert weldment 1102, which may be used as divert weldment 617 described previously, and may include any of the features described in relation to divert weldment 617. First divert weldment 1102 may extend between and couple one or more divert lumens of a gas splitter (such as divert lumens 606c of gas splitter 610) with an exhaust system such as a foreline 1130. For example, the first divert weldment 1102 may include one or more divert weldment inlets 1104 that may be coupled with the divert lumens of the gas splitter. Any number of divert weldment inlets 1104 may be provided. For example, the first divert weldment 1102 may include at least or about one divert weldment inlet 1104, at least or about two divert weldment inlets 1104, at least or about three divert weldment inlets 1104, at least or about four divert weldment inlets 1104, or more. As illustrated, the first divert weldment 1102 includes two divert weldment inlets 1104, which each may couple with a respective outlet of the divert lumens. For example, the divert lumens in the gas splitter may direct diverted process gases to a number of divert outlets that are coupled with the divert weldment inlets 1104 (with a number of divert weldment inlets 1104 matching the number of divert outlets).

The first divert weldment 1102 may include a number of divert weldment outlets. It is contemplated that any number of divert weldment outlets may be included on the first divert weldment 1102, such as three, four, five, six, seven, or more divert weldment outlets, with greater numbers of divert weldment outlets providing increased gas flow capacity/increasing the flow window through the divert architecture 1100 and reducing pressure within the first divert weldment 1102. As illustrated, the first divert weldment 1102 may include a first divert weldment outlet 1106 and a second divert weldment outlet 1108. Each of the first divert weldment outlet 1106 and the second divert weldment outlet 1108 may be fluidly coupled with the foreline 1130 as will be described in greater detail below.

By increasing the gas flow capacity and reducing pressure within the first divert weldment 1102, the divert architecture 1100 may accommodate higher flow rates of diverted process gases, which may enable higher flow rates of process gases to also be delivered to the process chambers and increase deposition rates. For example, the flow rate per processing chamber may be greater than or about 6,000 sccm, greater than or about 6,500 sccm, greater than or about 7,000 sccm, greater than or about 7,500 sccm, or more, while pressures in the divert architecture 1100 may be less than or about 140 Torr, less than or about 130 Torr, less than or about 120 Torr, less than or about 110 Torr, less than or about 100 Torr, less than or about 90 Torr, less than or about 80 Torr, less than or about 70 Torr, less than or about 60 Torr, or lower. Additionally, the increased gas flow capacity and reduced pressure within the divert architecture 1100 may enable passive flow devices to be used that facilitate higher flow rates. For example, diameters of the central orifices 650 in choke plates 640 may be enlarged to reduce choking and to support higher flow rates of process gases through the processing system. In some embodiments, the central orifices may each have a diameter of at least or about 1.3 mm, at least or about 1.35 mm, at least or about 1.4 mm, at least or about 1.45 mm, at least or about 1.5 mm, or more, with larger diameters leading to reduced flow choking and higher flow/deposition rates.

The first divert weldment 1102 may include a medial portion 1150 that extends between and fluidly couples each of the divert weldment inlets 1104 with the divert weldment outlets 1106, 1108. For example, the medial portion 1150 may join process gases flowing through each of the divert weldment inlets 1104 into a single stream. The stream of process gases may branch or otherwise split into separate and substantially equal flows through each of the first divert weldment outlets 1106, 1108.

The first divert weldment 1102 may be a single unitary piece or may be a plurality of pieces. The first divert weldment 1102 may, for example, include a first portion 1152 that may include the divert weldment inlets 1104 and/or part of the medial portion 1150. The first divert weldment 1102 may include a second portion 1154 that may be formed from one or more weldment pieces to form all or part of the medial portion 1150. The first divert weldment 1102 may include a third portion 1156, which may include the divert weldment outlets 1106, 1108. The first portion 1152, second portion 1154, and third portion 1156 may be coupled together to form the first divert weldment 1102.

As illustrated, the divert architecture 1100 may include a second divert weldment 1110. The second divert weldment 1110 may be a single unitary piece or may be a plurality of pieces. The second divert weldment 1110 may include a number of second divert weldment inlets. For example, the second divert weldment 1110 may have a number of second divert weldments that matches a number of the divert weldment outlets of the first divert weldment 1102. As illustrated, the second divert weldment 1110 may have a second divert weldment inlet 1112 and a third divert weldment inlet 1114. The second divert weldment inlet 1112 may be in fluid communication with the first divert weldment outlet 1106. The third divert weldment inlet 1114 may be in fluid communication with the second divert weldment outlet 1108. The second divert weldment 1110 may include a third divert weldment outlet 1116, which may be coupled with a foreline 1130 to exhaust process gases from the divert architecture 1100. Flow through each of the second divert weldment inlet 1112 and the third divert weldment inlet 1114 may be recombined within the second divert weldment 1110, with the combined flow exiting the divert architecture 1100 through the third divert weldment outlet 1116.

The divert architecture 1100 may include a number of valves that are coupled between each of the divert weldment outlets of the first divert weldment 1102 and a respective one of the divert weldment inlets of the second divert weldment 1110. For example, a number of valves may match a number of the divert weldment outlets of the first divert weldment 1102 and/or a number of the divert weldment inlets of the second divert weldment 1110. As illustrated, the divert architecture 1100 includes a first valve 1122 that couples the second divert weldment inlet 1112 to the first divert weldment outlet 1106. The divert architecture 1100 may include a second valve 1124. The second valve 1124 may couple the third divert weldment inlet 1114 to the second divert weldment outlet 1108. The first valve 1122 and the second valve 1124 may prevent or reduce backstreaming. For example, when process gases are not currently being exhausted out of the divert architecture 1100, the first valve 1122 and the second valve 1124 may be closed to prevent any gases within the foreline 1130 from backstreaming into the first divert weldment 1102 and/or back into the gas splitter. The first valve 1122 and the second valve 1124 may be opened while actively diverting gases to permit the diverted process gases to be exhausted and/or otherwise evacuated from the divert architecture 1100 and into the foreline 1130. The first valve 1122 and the second valve 1124 may be the same valve or may be different valves. The first valve 1122 and/or the second valve 1124 may have a valve flow coefficient greater than or about 0.3 to less than or about 0.9. For example, the first valve 1122 and/or the second valve 1124 may each have a valve flow coefficient greater than or about 0.4 to less than or about 0.9, greater than or about 0.5 to less than or about 0.9, greater than or about 0.6 to less than or about 0.9, greater than or about 0.7 to less than or about 0.9, greater than or about 0.8 to less than or about 0.9, greater than or about 0.3 to less than or about 0.8, greater than or about 0.3 to less than or about 0.7, greater than or about 0.3 to less than or about 0.6, greater than or about 0.3 to less than or about 0.5, or greater than or about 0.3 to less than or about 0.4.

The divert architecture 1100 may include a number of divert weldment filters that may be interfaced downstream of each of the divert weldments of the first divert weldment 1102. For example, the divert architecture 1100 may include a first divert weldment filter 1126 disposed upstream of the first valve 1122 between the first valve 1122 and the first divert weldment outlet 1106. The divert architecture 1100 may include a second divert weldment filter 1128 disposed upstream of the second valve 1124 between the second valve 1124 and the second divert weldment 1108. The first divert weldment filter 1126 and the second divert weldment filter 1128 may be the same filter or may be different filter. The first divert weldment filter 1126 and/or the second divert weldment filter 1128 may have a flow coefficient greater than or about 0.3 to less than or about 0.9. For example, the first divert weldment filter 1126 and/or the second divert weldment filter 1128 may have a flow coefficient greater than or about 0.6 to less than or about 0.9, greater than or about 0.7 to less than or about 0.9, greater than or about 0.8 to less than or about 0.9, greater than or about 0.6 to less than or about 0.8, or greater than or about 0.6 to less than or about 0.7. The filters may be utilized to filter out any particles within the divert weldment due to backstreaming of gases.

As discussed above, the process gas lumens and the divert lumens defined with a gas splitter may be fluidly coupled via at least one valve. A valve block may be coupled with the at least one valve. The valve block may be coupled to the gas splitter. The divert architecture 1100, such as the first divert weldment 1102 or the second divert weldment 1110, may be in fluid communication with foreline 1130. For example, the third divert weldment outlet 1116 of the second divert weldment 1110 may be coupled with the foreline 1130. The foreline 1130 may pump out and/or otherwise exhaust gases and particulate when the process gases are diverted away from the processing chambers.

The first divert weldment 1102 may be surrounded by one or more heater jackets 1140. In embodiments, the first divert weldment 1102 may be surrounded by between one and five heater jackets 1140. For example, the first divert weldment 1102 may be surrounded by between one and four heater jackets 1140, between one and three heater jackets 1140, or between one and two heater jackets 1140. In some embodiments, each portion of the first divert weldment 1102 may include one or more heater jackets 1140. For example, the first portion 1152, second portion 1154, and/or third portion 1156 may each include one or more dedicated heater jackets 1140. This may enable any number of heater jackets 1140 to be used to match the contours of the first divert weldment 1102, which may simplify manufacture, installation, and/or servicing of the heater jackets 1140 and/or first divert weldment 1102. Other portions of the divert architecture 1100 may be surrounded by heater jackets 1140. For example, the second divert weldment 1110, the first valve 1122, second valve 1124, and/or the divert weldment filters 1126, 1128 may be surrounded by heater jackets 1140. Each of the heater jackets 1140 may insulate all or a portion of a respective region of the divert architecture 1100 to maintain the diverted process gases at a desired temperature. For example, the process gases may be heated proximate a gas panel and/or in the gas splitter. The heater jackets 1140 may help maintain the temperature of the heated diverted process gases. By maintaining the temperature of the diverted process gases at a desired level (as well as providing an increased pressure window), condensation from the process gases may be reduced within the divert architecture 1100. The reduction in condensation may prevent buildup of residue within the divert architecture and may help maintain the desired flow characteristics of the divert architecture 1100.

The divert weldments may have any internal diameter that may be based on one or more factors, such as the volume of fluid to be passed through the divert architecture 1100, a maximum flow rate through the divert architecture 1100, a maximum pressure through the divert architecture 1100, characteristics of passive flow control devices (such as the central orifices 650 in choke plates 640), a number of divert weldment outlets in the first divert weldment 1102, and/or other factors. In embodiments, the divert weldments, such as the first divert weldment 1102 and/or the second divert weldment 1110, may have an internal diameter of greater than or about 5.0 mm to less than or about 20.0 mm. For example, the internal diameter may be greater than or about 7.5 mm to less than or about 20.0 mm, greater than or about 10.0 mm to less than or about 20.0 mm, greater than or about 12.5 mm to less than or about 20.0 mm, greater than or about 15.0 mm to less than or about 20.0 mm, greater than or about 17.5 mm to less than or about 20.0 mm, greater than or about 5.0 mm to less than or about 17.5 mm, greater than or about 5.0 mm to less than or about 15.0 mm, greater than or about 5.0 mm to less than or about 12.5 mm, greater than or about 5.0 mm to less than or about 10.0 mm, or greater than or about 5.0 mm to less than or about 7.5 mm. In some embodiments, each weldment or portion thereof within the divert architecture 1100 may have a same internal diameter, while in other embodiments one or more weldments (or portions thereof) may have different internal diameters.

Figure 12:
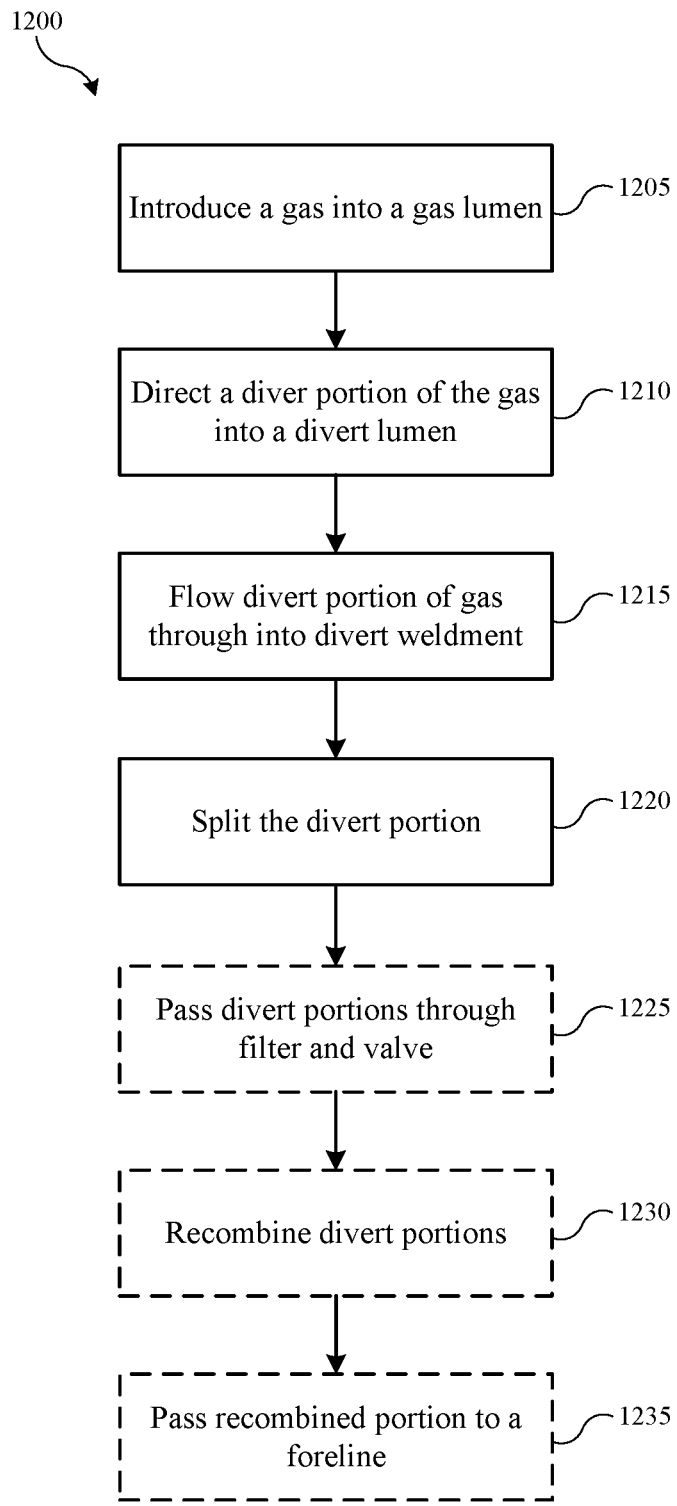
FIG. 12 shows operations of an exemplary semiconductor processing method according to some embodiments of the present technology.

FIG. 12 shows operations of an exemplary semiconductor processing method 1200 according to some embodiments of the present technology. The method may be performed using a variety of processing systems, including processing systems 100, 300, and 600 described above. Method 1200 may include a number of optional operations, which may or may not be specifically associated with some embodiments of methods according to the present technology.

Method 1200 may be performed to divert process gases away from a number of processing chambers. For example, a portion of process gases may be diverted from one or more of the processing chambers to tune a flow rate of the process gases to the various chambers, such as to equalize flow to each chamber. In other instances, the process gases may be diverted away from each of the processing chambers to enable a flow rate of the process gases to be ramped up to a full flow rate prior to delivery to the chambers. The method may include optional operations prior to initiation of method 1200, or the method may include additional operations. For example, method 1200 may include operations performed in different orders than illustrated. At step 1205, the method 1200 may include introducing a gas into one or more gas lumens defined by a gas splitter via a gas inlet end of the gas lumens. The gas may be any process gas, such as precursors and/or any carrier gas used in operations performed in the processing system. At step 1210, the method 1200 may include directing a divert portion of the gas into one or more divert lumens that are fluidly coupled with at least one of the gas lumens. As described above, the gas lumens and/or divert lumens may be defined with the gas splitter, which may be similar to gas splitter 610 in some embodiments. The divert portion of the gas may be less than or equal to a volume of the initial gas introduced into the gas lumen. A portion of the gas may be flowed to one or more processing regions of one or more of the processing chambers in some instances. In other instances all of the process gases may be diverted away from the processing chambers for some period of time.

At step 1215, the method 1200 may include flowing the divert portion of the gas through the divert lumens and into a divert weldment. The divert weldment may include any of the components, characteristics as described above and may be or include the divert weldment 617 or 1102 and/or other components of divert architecture 1100. At step 1220, the method 1200 may include splitting the flow of the divert portion of the gas into a first divert portion and a second divert portion through a first divert weldment outlet and a second divert weldment outlet.

At optional step 1225, the method 1200 may include passing the first divert portion of the gas through a first filter and/or a first valve and/or passing the second divert portion of the gas through a second filter and/or a second valve. At optional step 1230, the method 1200 may include recombining the first divert portion of the gas and the second divert portion of the gas. In some embodiments, the first divert portion of the gas and the second divert portion of the gas may be recombined after flowing the first divert portion of the gas and the second divert portion of the gas through the first filter and the second filter and/or the first valve and the second valve. At optional step 1235, the method 1200 may include passing a recombined first divert portion of the gas and the second divert portion of the gas to a foreline.

By splitting the flow of the divert portion of the gas into a first divert portion and a second divert portion through a first divert weldment outlet and a second divert weldment outlet, the divert architecture may accommodate higher flow rates due to reduced pressures in the weldments. This may enable the processing system to utilize greater flow rates of process gases for delivery to each processing chamber, which may increase deposition rates within each chamber. For example, the flow per processing region in the processing system associated with the gas splitter may be greater than or about 6,000 sccm, greater than or about 6,500 sccm, greater than or about 7,000 sccm, greater than or about 7,500 sccm, or more. Pressures in the divert weldments may be less than or about 140 Torr, less than or about 130 Torr, less than or about 120 Torr, less than or about 110 Torr, less than or about 100 Torr, less than or about 90 Torr, less than or about 80 Torr, less than or about 70 Torr, less than or about 60 Torr, or lower. Conventional technologies, conversely, may not be able to supply flow at rates of greater than or about 5,800 per processing region without choking the flow or be able to operate at pressures of less than 215 Torr.

The reduced pressure within the divert architecture may allow a gas flow regime being introduced to the gas splitter and to the processing region(s) to be increased. By increasing the gas flow regime, better structures may be formed in the processing system. The split of divert weldment may increase the conductance in the divert weldment, which may reduce downstream pressure as previously discussed. As previously discussed, reducing downstream pressure may allow a size of a central orifice defined in a choke plate to be increased, which may enable higher flow rates to be provided to the processing system. Higher flow rates may desirably increase the deposition rate or may allow for additional processing chambers or processing regions in the processing system. Furthermore, by decreasing the pressure in the divert weldments, risks associated with pressure spikes (such as the occurrence of condensation) may be reduced as the decrease in pressure within the divert architecture also reduces the instantaneous pressure differential that may occur as valves coupled with the divert architecture are opened and/or closed. That is, there is a larger acceptable range for pressure to increase as the operating pressure is lower than in conventional divert weldments.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a lid plate" includes a plurality of such lid plates, and reference to "the gas splitter" includes reference to one or more gas splitters and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A semiconductor processing system, comprising:
   a plurality of processing chambers, each processing chamber defining a processing region;
   a lid plate positioned above the plurality of processing chambers;
   a gas splitter seated on the lid plate, the gas splitter comprising a top surface and a plurality of side surfaces, wherein the gas splitter defines:
     one or more gas inlets;
     one or more gas outlets;
     one or more gas lumens that extend between and fluidly couple the one or more gas inlets with each of the one or more gas outlets; and
     a divert lumen that is fluidly coupled with the one or more gas lumens and that directs gases away from one of the plurality of processing chambers through a divert outlet; and
   a first divert weldment that extends from and fluidly couples to the divert outlet, wherein the first divert weldment comprises a first divert weldment outlet and a second divert weldment outlet.

2. The semiconductor processing system of claim 1, further comprising:
   a second divert weldment having a second divert weldment inlet and a third divert weldment inlet, wherein:
     the second divert weldment inlet is in fluid communication with the first divert weldment outlet; and
     the third divert weldment inlet is in fluid communication with the second divert weldment outlet.

3. The semiconductor processing system of claim 2, further comprising:
   a first valve coupling the second divert weldment inlet to the first divert weldment outlet; and
   a second valve coupling the third divert weldment inlet to the second divert weldment outlet.

4. The semiconductor processing system of claim 3, further comprising:
   a first divert weldment filter disposed upstream of the first valve; and
   a second divert weldment filter disposed upstream of the second valve.

5. The semiconductor processing system of claim 1, wherein:
   the first divert weldment is in fluid communication with a foreline.

6. The semiconductor processing system of claim 1, further comprising:
   between one and five heater jackets surrounding the first divert weldment.

7. A semiconductor processing system, comprising:
   a lid plate;
   a gas splitter seated on the lid plate, the gas splitter comprising a top surface and a plurality of side surfaces, wherein the gas splitter defines:
     a gas inlet;
     a gas outlet;
     a gas lumen that extends between and fluidly couples the gas inlet with the gas outlet; and
     a divert lumen that is fluidly coupled with the gas lumen and that directs gases away from a processing chamber through a divert outlet; and
   a first divert weldment that extends from and fluidly couples to the divert outlet, wherein the first divert weldment comprises a first divert weldment outlet and a second divert weldment outlet.

8. The semiconductor processing system of claim 7, further comprising:
   a foreline in fluid communication with the first divert weldment.

9. The semiconductor processing system of claim 8, further comprising:
   a second divert weldment having a second divert weldment inlet, a third divert weldment inlet, and a third divert weldment outlet, wherein:
     the second divert weldment inlet is coupled with the first divert weldment outlet;
     the third divert weldment inlet is coupled with the second divert weldment outlet; and
     the third divert weldment outlet is coupled with the foreline.

10. The semiconductor processing system of claim 9, further comprising:
    a first valve coupling the second divert weldment inlet to the first divert weldment outlet; and
    a second valve coupling the third divert weldment inlet to the second divert weldment outlet.

11. The semiconductor processing system of claim 10, wherein:
the first valve and the second valve have a valve flow coefficient greater than or about 0.3 to less than or about 0.9.

12. The semiconductor processing system of claim 7, wherein:
the gas lumen and the divert lumen are fluidly coupled via at least one valve.

13. The semiconductor processing system of claim 12, further comprising:
a valve block coupled with the at least one valve, wherein the valve block is coupled to the gas splitter.

14. The semiconductor processing system of claim 7, wherein:
the first divert weldment has an internal diameter of greater than or about 5.0 mm to less than or about 20.0 mm.

15. The semiconductor processing system of claim 7, further comprising:
between one and five heater jackets surrounding the first divert weldment.

16. A semiconductor processing method comprising:
introducing a gas into a gas lumen defined by a gas splitter via a gas inlet end of the gas lumen;
directing a divert portion of the gas into a divert lumen that is fluidly coupled with the gas lumen;
flowing the divert portion of the gas through the divert lumen and into a divert weldment; and
splitting the flow of the divert portion of the gas into a first divert portion and a second divert portion through a first divert weldment outlet and a second divert weldment outlet.

17. The semiconductor processing method of claim 16, further comprising:
passing the first divert portion of the gas through a first filter and a first valve; and
passing the second divert portion of the gas through a second filter and a second valve.

18. The semiconductor processing method of claim 17, further comprising:
recombining the first divert portion of the gas and the second divert portion of the gas after flowing the first divert portion of the gas and the second divert portion of the gas through the first filter and the second filter.

19. The semiconductor processing method of claim 18, further comprising:
passing a recombined first divert portion of the gas and the second divert portion of the gas to a foreline.

20. The semiconductor processing method of claim 16, wherein:
a pressure in the divert weldment is less than or about 150 Torr.

* * * * *